US007528676B2

(12) United States Patent
Kearns et al.

(10) Patent No.: US 7,528,676 B2
(45) Date of Patent: May 5, 2009

(54) BALUN CIRCUIT SUITABLE FOR INTEGRATION WITH CHIP ANTENNA

(75) Inventors: Brian Kearns, Dublin (IE); Denver Humphrey, Broughshane (IE); Joseph Modro, Dublin (IE)

(73) Assignee: TDK Corporation, Tokyo (JP)

( * ) Notice: Subject to any disclaimer, the term of this patent is extended or adjusted under 35 U.S.C. 154(b) by 226 days.

(21) Appl. No.: 11/785,228

(22) Filed: Apr. 16, 2007

(65) Prior Publication Data

US 2008/0252393 A1 Oct. 16, 2008

(51) Int. Cl.
*H03H 7/42* (2006.01)
*H01P 1/10* (2006.01)

(52) U.S. Cl. ........................................ 333/26; 333/185

(58) Field of Classification Search .................. 333/25, 333/26, 185

See application file for complete search history.

(56) References Cited

U.S. PATENT DOCUMENTS

| | | | | |
|---|---|---|---|---|
| 5,949,299 | A | 9/1999 | Harada | |
| 6,292,070 | B1 | 9/2001 | Merrill | |
| 6,396,362 | B1 | 5/2002 | Mourant et al. | |
| 6,801,101 | B2 | 10/2004 | Hiroshima et al. | |
| 6,819,199 | B2 * | 11/2004 | Burns et al. | 333/26 |
| 7,042,402 | B2 | 5/2006 | Modro | |
| 7,250,828 | B2 * | 7/2007 | Erb | 333/26 |
| 7,397,328 | B2 * | 7/2008 | Yasuda et al. | 333/204 |
| 7,468,640 | B2 * | 12/2008 | Nosaka | 333/26 |

OTHER PUBLICATIONS

Gavela I. et al., "A Small Size LTCC Balun for Wireless Applications," 2004, Proceedings of the European Microwave Conference, pp. 373-376.

* cited by examiner

*Primary Examiner*—Dean O Takaoka
(74) *Attorney, Agent, or Firm*—Oliff & Berridge, PLC

(57) ABSTRACT

A balun including a single-ended port, a differential port and first and second sets of coupled transmission line sections. Each set has three coupled transmission line sections. The signal carrying terminal of the single-ended port is connected to an inner end of a third coupled transmission line sections in one of the sets, and the terminals of the differential port are connected to a respective outer end of a respective first transmission line. The balun is fabricated in a multi-layer insulating substrate with the single-ended port located on an upper surface of the substrate and the differential port located on a lower surface of the substrate. The balun is suitable for connection to a chip antenna mounted on a common carrier substrate.

21 Claims, 7 Drawing Sheets

BALUN CIRCUIT SUITABLE FOR INTEGRATION WITH CHIP ANTENNA

FIELD OF THE INVENTION

The present invention relates to baluns. The invention relates particularly to baluns for use with antennae of wireless communications devices.

BACKGROUND OF THE INVENTION

Differential circuits have been employed in wireless cellular communications handsets and other wireless systems for many years. The principal benefits from using differential circuits as opposed to single-ended circuits are lower noise and lower susceptibility to interference. Despite the benefits of differential circuits, some of the components used in a modern wireless communications systems remain single-ended. For example, single-ended antennae are more common than differential antennae. In cases where wireless communications systems include single-ended and differential components, it is necessary to include devices which convert the single-ended signals which are incident on and emitted from the single-ended components to differential signals which are incident on and emitted from the differential components. Conversely, devices which convert the differential signals which are incident on and emitted from the differential components to single-ended signals which are incident on and emitted from the single-ended components are also required.

Such devices are often referred to as baluns. Figures of merit for describing the electrical characteristics of a balun which converts a single-ended signal to a differential signal are the single-ended to differential mode response, the single-ended to common mode response, the amplitude balance, and the phase balance. Figures of merit for describing the electrical characteristics of a balun which converts a differential signal to a single-ended signal are the differential mode to single-ended response, the common mode to single-ended response, and the amplitude and phase balance.

A balun can be implemented by a number of discrete components. Balun topologies employing discrete components are taught in U.S. Pat. No. 5,949,299 (Harada) and U.S. Pat. No. 6,396,362 (Mourant et al). Baluns can also be implemented using distributed components, normally employing pairs of serially connected quarter-wavelength coupled lines. A popular form of the distributed balun is often referred to as a Marchand balun. A variation of the Marchand balun is taught in U.S. patent US06292070 (Merrill) and is commonly referred to as a backwards-wave balun. Distributed baluns such as the Marchand balun and the backwards-wave balun typically offer excellent performance over a wide bandwidth.

FIG. 1 shows the structure of a conventional Marchand balun, the structure has a first pair of transmission lines 10A, 10B, a second pair of transmission lines 11A, 11B, a differential port 12 and a single-ended port 13. The length of each transmission line is substantially equal to one quarter of the wavelength at the centre of the operating frequency band of the balun. During use, electromagnetic coupling occurs between the respective transmission lines in each pair 10A, 10B and 11A, 11B.

The structure of a backwards-wave balun is depicted in FIG. 2, the structure has a first pair of transmission lines 20A, 20B, a second pair of transmission lines 21A, 21B, a differential port 22 and a single-ended port 23. The length of each transmission line is substantially equal to one quarter of the wavelength at the centre of the operating frequency band of the balun. During use, electromagnetic coupling occurs between the respective transmission lines in each pair 20A, 20B and 21A, 21B.

FIG. 3 shows a size-reduced Marchand balun as described in Gavela I., Falagan M. A., Fluhr H.; "A Small Size LTCC Balun for Wireless Applications"; Proceedings of the European Microwave Conference 2004; pp 373-376. The structure of this balun is similar to that of FIG. 1 and includes a first pair of transmission lines 30A, 30B, a second pair of transmission lines 31A, 31B, a differential port 32 and a single-ended port 33. In addition, two shunt capacitors 34A and 34B are provided, as shown, with the effect that the required length of each of transmission lines 30A, 30B and 31A, 31B is less than one quarter of the wavelength at the centre of the operating frequency band of the balun.

FIG. 4 shows another size-reduced balun as taught in U.S. Pat. No. 6,801,101 (Hiroshima et al); the balun includes a first pair of transmission lines 40A, 40B, a second pair of transmission lines 41A, 41B, a differential port 42 and a single-ended port 43. The balun additionally includes shunt capacitors 44A, 44B, 45A, 45B and 46, as shown, an effect of which is that the required length of each of the transmission lines is less than one quarter of the wavelength at the centre of the operating frequency band of the balun.

Where an antenna having a single-ended input/output (I/O) port is required to be connected to a differential I/O port of a transceiver, a balun is required. However, connection from the single-ended I/O port of the antenna to the differential I/O port of the transceiver is not always readily achievable using conventional baluns. For example, FIG. 5 shows a chip antenna 50 as taught in U.S. Pat. No. 7,042,402 (Modro). The chip antenna 50 is typically mounted on a PCB or substrate 57 so that the main radiating section is at a raised elevation relative to the surface of the substrate 57. Consequently, the co-planar single-ended-port of the antenna, comprising signal-carrying terminal 52 and ground terminals 53B and 53B, are also at a raised elevation relative to the surface of the substrate 57. On the other hand, the terminals (not shown) of the differential port of a transceiver (not shown), or other transmitter or receiver circuitry, to which the antenna is to be connected via a balun are normally located on the surface of the substrate 57.

Unfortunately, none of the conventional balun circuits shown in FIGS. 1, 3 or 4 can be easily arranged to provide a balun with signal-carrying terminals appropriately located on upper and lower faces to allow the antenna 50 to be coupled to a transceiver because, in each case, the single ended I/O port is located at one end of the balun structure.

The I/O ports of the backwards wave balun of FIG. 2 are suitably positioned so that a backwards wave balun could be arranged to provide signal-carrying terminals located as required on the upper and lower faces of the balun. However, the requirement for three direct connections to electrical ground on the single-ended side of the backwards-wave balun of FIG. 2 represents a significant design challenge at radio frequencies (RF), because the required elevation of the signal-carrying terminal of the single-ended port of the balun, and the required lower location of the terminals of its differential port dictate that coupled line sections 20A and 21A should be located towards the lower section of the balun and coupled line sections 20B and 21B should be located near the upper section of the balun. Hence, the ground connections would necessarily be made using long metal filled via holes inside the balun, but there is an inevitable parasitic inductance associated with such via holes.

SUMMARY OF THE INVENTION

Accordingly, the invention provides a balun comprising a single-ended port comprising a signal-carrying terminal; a differential port comprising a first signal-carrying terminal and a second signal-carrying terminal; and first and second sets of coupled transmission line sections, said first and second sets being located adjacent to one another; each of said first and second sets comprising a respective first transmission line section and a respective second transmission line section, each transmission line section within each set having a respective inner end and a respective outer end, said respective first transmission line sections being connected together in series at their respective inner ends, said respective second transmission line sections being connected together in series at their respective inner ends, wherein each of said first and second sets includes a respective third coupled transmission line section having a respective outer end connected to the respective outer end of the respective second transmission line section, and wherein said signal-carrying terminal of said single-ended port is connected to an inner end of one of said third coupled transmission line sections, and wherein said first and second signal-carrying terminals of said differential port are connected to a respective outer end of said first transmission line sections.

The balun may be formed within a parallelepiped shaped substrate, wherein said single-ended I/O port comprises a single signal-carrying terminal, said differential I/O port comprises a first and second signal-carrying terminal, wherein said single-ended port is located on an upper face of said parallelepiped, wherein said differential port is located on a lower face of said parallelepiped, wherein said first and second signal-carrying terminals of said differential port are positioned approximately symmetrically about an intersecting plane of said parallelepiped which intersects said lower and said upper face along medians of said faces and wherein said single signal-carrying terminal of said single-ended port is positioned so that it is intersected by said median of said upper face.

Preferably, said first and second sets of coupled transmission line sections comprise transmission line sections which are broadside coupled.

Preferably, said first transmission line section of said first set and said first transmission line section of said second set are located towards the lower face of said parallelepiped, and said third transmission line section of said first set and said third transmission line section of said second set are located towards the upper face of said parallelepiped.

Preferably, said transmission line sections of said first and second sets of coupled transmission line sections of said balun are not connected directly to electrical ground at any point along their lengths, and moreover, connections to electrical ground are made via shunt capacitors of said balun.

Further advantageous aspects of the invention will be apparent to those ordinarily skilled in the art upon review of the following description of specific embodiments of the invention and with reference to the accompanying drawings.

BRIEF DESCRIPTION OF THE DRAWINGS

Embodiments of the invention are now described by way of example and with reference to the accompanying drawings in which like numerals are used to indicate like parts and in which.

DETAILED DESCRIPTION OF THE DRAWINGS

Figure 1:
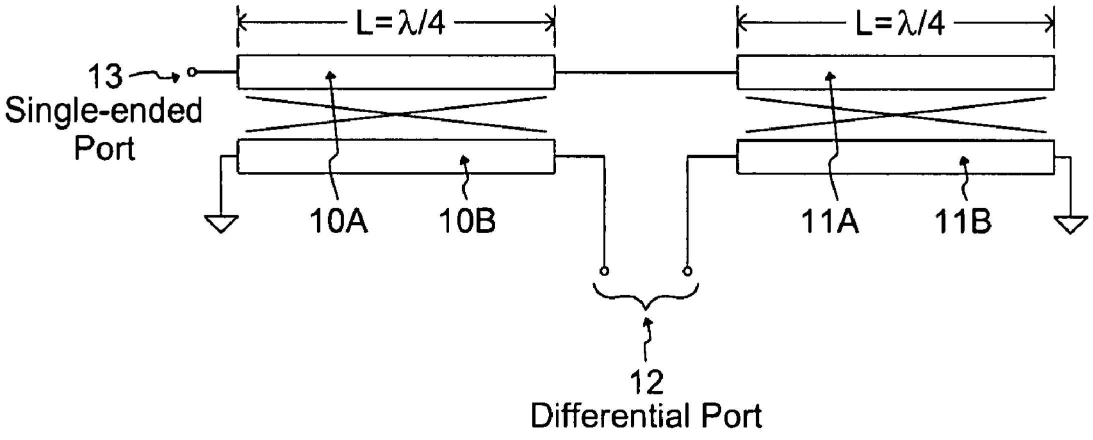
FIG. 1 (Prior Art)
FIG. 1 shows a prior art Marchand balun.
Figure 2:
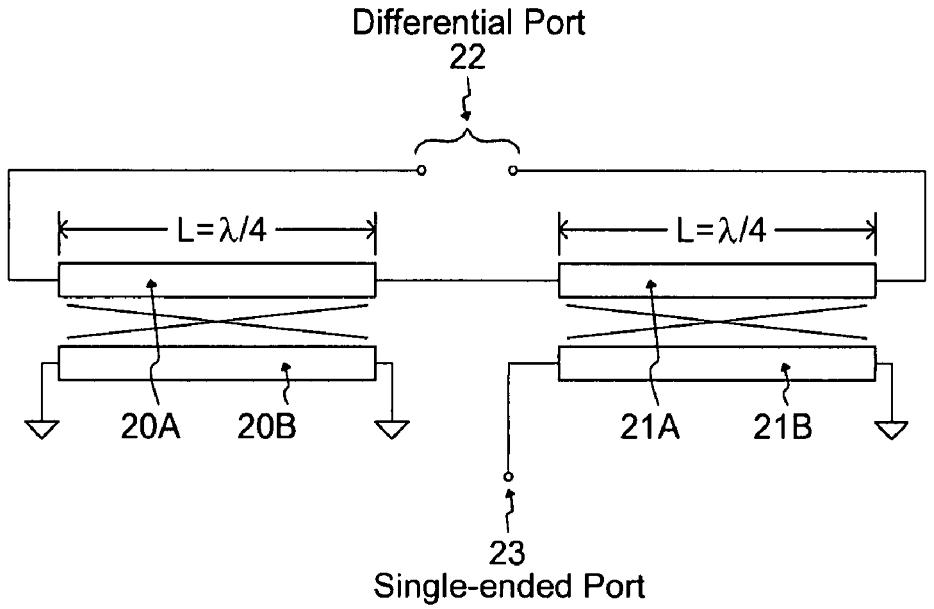
FIG. 2 (Prior Art)
FIG. 2 shows a prior art a backwards-wave balun.
Figure 3:
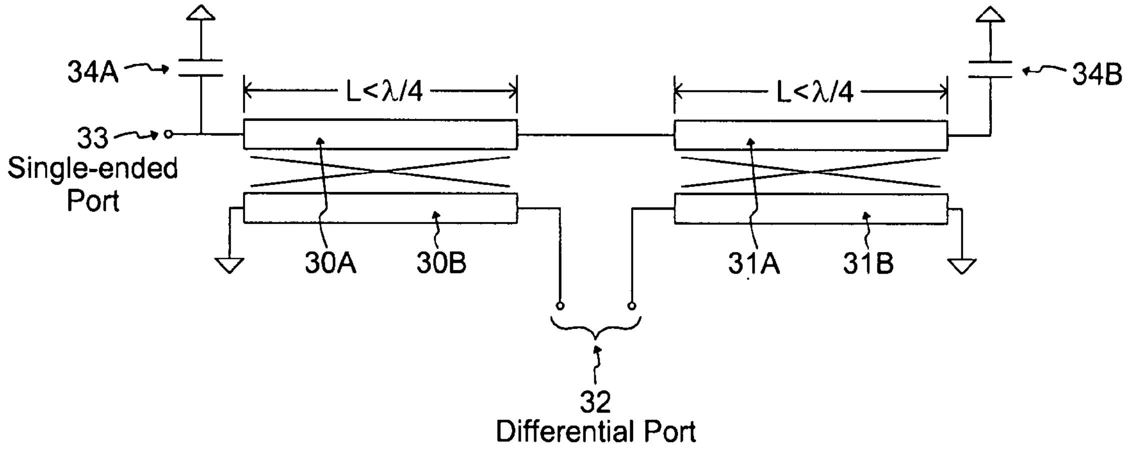
FIG. 3 (Prior Art)
FIG. 3 shows a prior art size-reduced Marchand balun.
Figure 4:
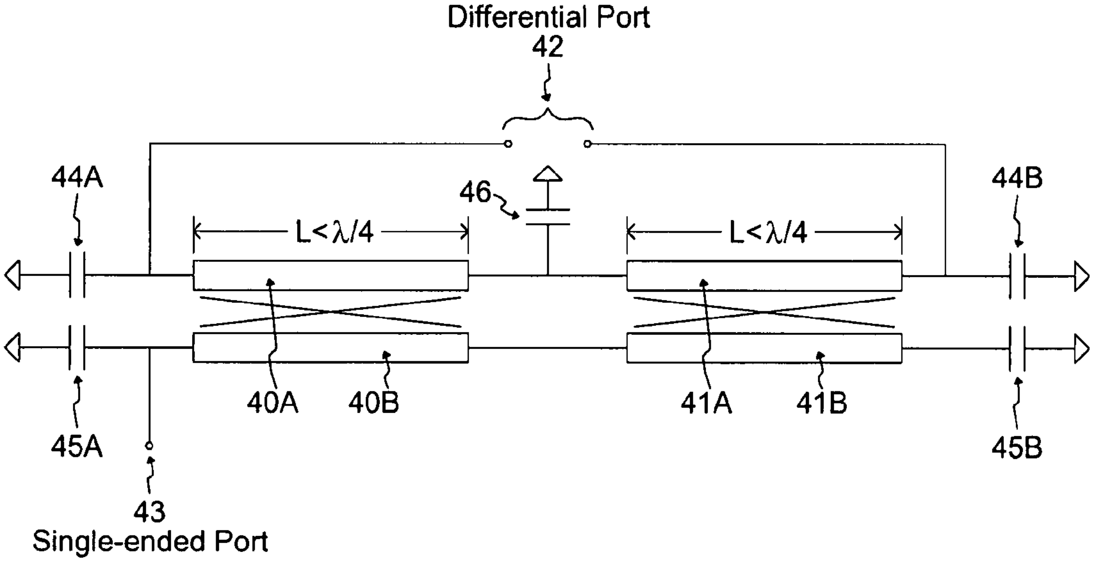
FIG. 4 (Prior Art)
FIG. 4 shows an alternative prior art size-reduced balun.
Figure 5:
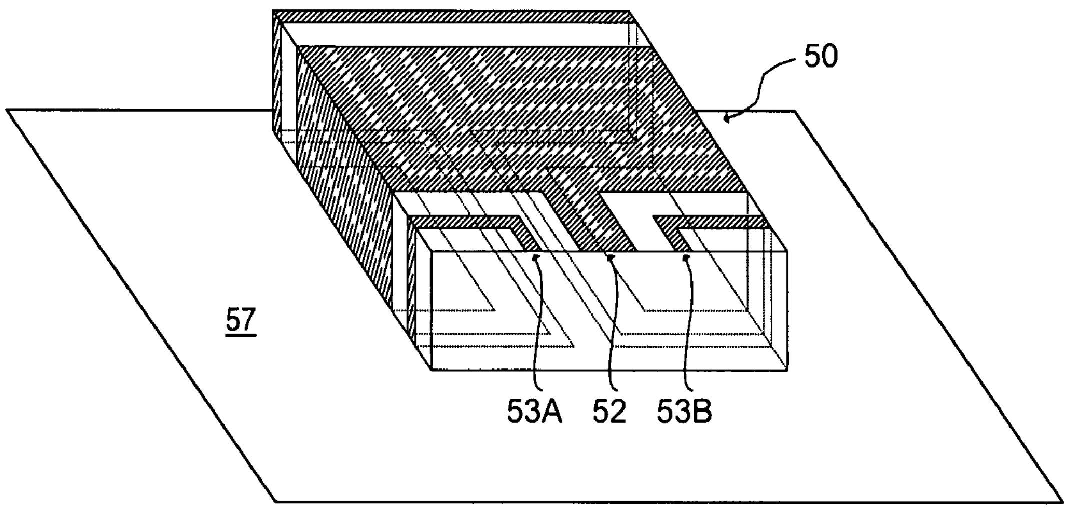
FIG. 5 (Prior Art)
FIG. 5 shows a known chip antenna with a single-ended I/O port at a raised elevation relative to a mounting surface of the antenna.
Figure 6:
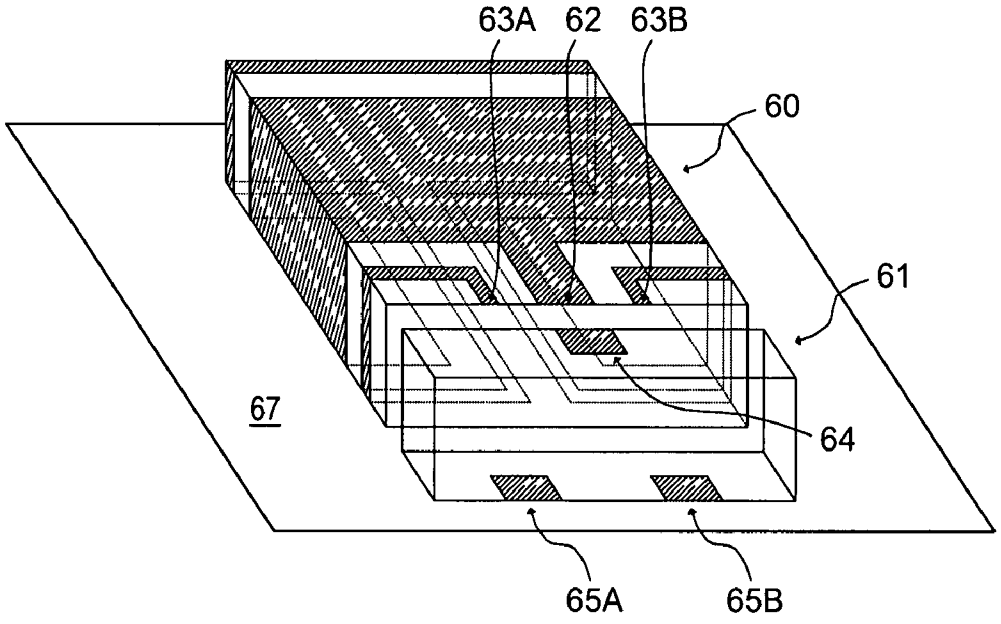
FIG. 6 shows an RF circuit comprising the single-ended antenna of FIG. 5 and a balun embodying the invention.

FIG. 6 shows an example of an implementation of an RF circuit comprising the single-ended antenna 60 corresponding to the single-ended antenna 50 of FIG. 5 and a balun 61 embodying one aspect of the invention. The balun 61 includes a single-ended port comprising signal-carrying terminal 64 and a differential port comprising signal-carrying terminals 65A and 65B where the terminals of the balun 61 are arranged so that antenna 60 and the balun 61 are easily aligned and can be mounted on common substrate 67 in a space saving manner. The signal-carrying terminals 65A, 65B are suitable for connection to corresponding terminals of a differential port of transceiver circuitry (not shown) or other circuitry for receiving and/or transmitting signals via the antenna 60. The preferred way to realize balun 61 is as a distributed circuit comprising coupled line sections fabricated in a multilayered substrate such as low temperature co-fired ceramic (LTCC). It is advantageous to use broadside coupled line sections since they offer the benefit over edge coupled line sections that the transition from signal-carrying terminals 65A and 65B of the differential port of the balun 61 to signal-carrying terminal 64 of the single-ended port of the balun 61 can be achieved using relatively short metal filled via holes formed within the substrate of the balun 61.

Figure 7:
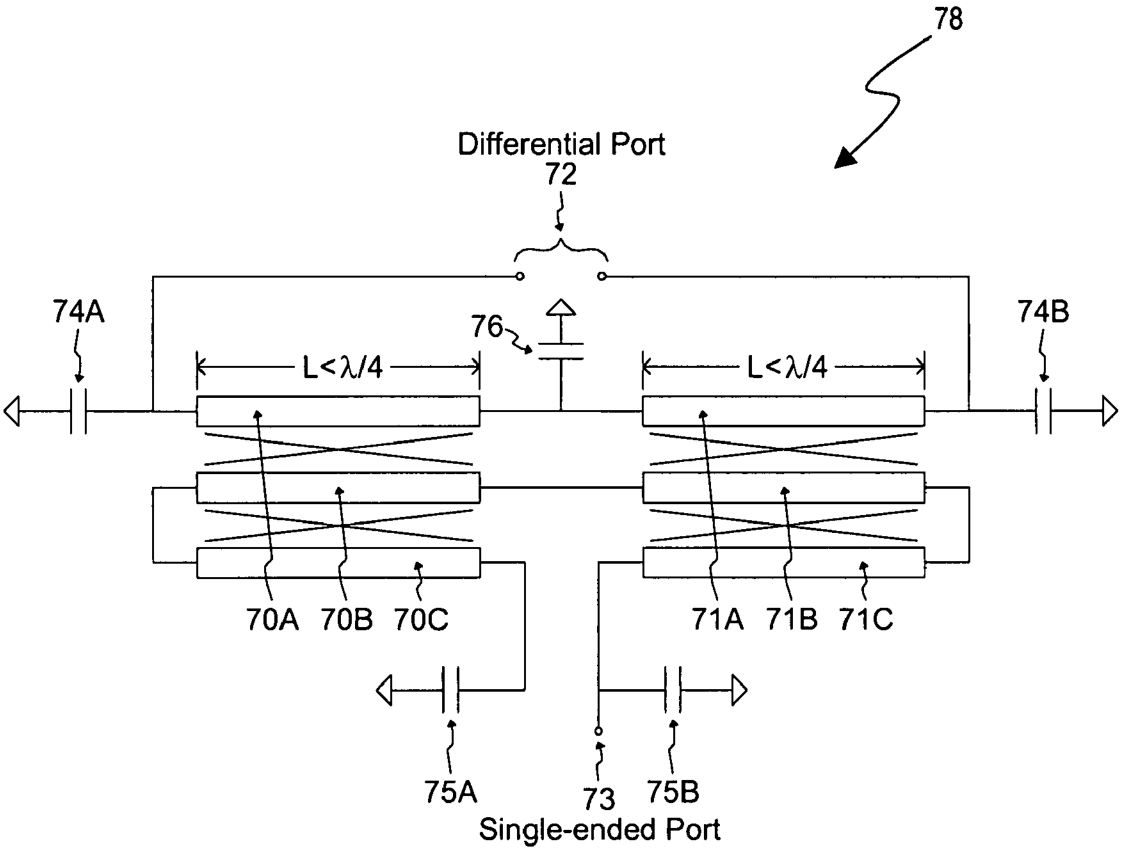
FIG. 7 shows a balun circuit suitable for use in the balun of FIG. 6.

FIG. 7 shows a balun circuit 78 embodying one aspect of the invention and suitable for use as the balun 61. The balun 78 comprises a differential I/O port 72 and a single ended I/O port 73, and has a specified operating frequency band over which a balanced signal incident on the differential port 72 is converted to an unbalanced signal emitted from the single-ended port 73, and vice versa. The balun 78 comprises a first set of coupled transmission line sections 70A, 70B, 70C, and a second set of coupled transmission line sections 71A, 71B and 71C. Coupled transmission line sections 70A and 71A are connected in series with one another and coupled transmission line sections 70B and 71B are also connected in series with one another. The first and second sets of transmission line sections are located adjacent to one another so that each transmission line section of a given set has an inner end which is proximal or adjacent to the other set, and an outer end which is distal the other set. The outer ends of coupled transmission line sections 70A and 71A are connected to a respective terminal of the differential port 72. The outer ends of coupled transmission line sections 70B and 71B are connected respectively to the outer ends of coupled transmission line sections 70C and 71C. The inner end of coupled transmission line section 71C is connected to the signal-carrying terminal of the single-ended port 73.

Preferably, the balun 78 of FIG. 7 includes size-reducing shunt capacitors 74A and 74B, connected to the respective outer ends of coupled transmission line sections 70A and 71A. It is also preferred that the balun 78 includes size-reducing shunt capacitors 75A and 75B, connected to the respective inner ends of coupled transmission line sections 70C and 71C. The effect of size-reducing shunt capacitors 74A, 74B, 75A and 75B is that the required electrical length of each of coupled transmission line sections 70A, 70B, and 70C, and 71A, 71B, and 71C is less than one quarter of a wavelength at the centre of the operating frequency band of the balun. In an alternative embodiment (not illustrated), where shunt capacitors 74A, 74B, 75A, 75B are omitted, the electrical length of each of coupled transmission line sections 70A, 70B, and 70C, and 71A, 71B, and 71C is substantially equal to one quarter of a wavelength at the centre of the operating frequency band of the balun.

Preferably, the balun 78 includes a shunt capacitor 76 connected at the node where the respective inner ends of coupled transmission line sections 70A and 71A are connected together. The effect of shunt capacitor 76 is to improve the ratio of the single-ended to differential mode response of the balun 78 and the single-ended to common mode response of the balun 78 over a given frequency range. Preferably, the frequency range over which the improvement offered by shunt capacitor 76 coincides with the operating band of the balun 78. The improvement in the ratio of the single-ended to differential mode response and the single-ended to common mode response of the balun 78 arising from shunt capacitor 76 is due to a reduction in the odd mode impedance between the outer ends of coupled line sections 70A and 71A.

Figure 8:
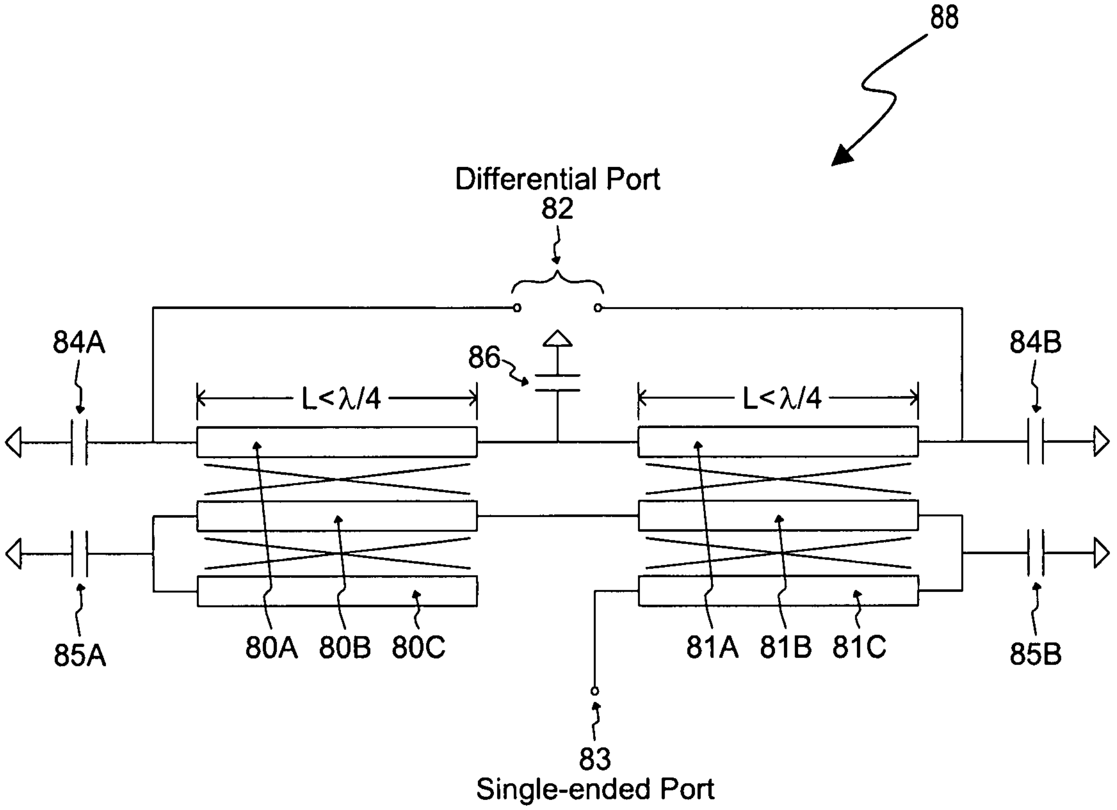
FIG. 8 shows an alternative balun circuit suitable for use in the balun of FIG. 6.

FIG. 8 shows an alternative embodiment of a balun circuit 88. The balun 88 comprises a differential I/O port 82 and a single-ended I/O port 83 and has a specified operating frequency band. The balun 88 comprises a first set of coupled transmission line sections 80A, 80B, 80C, and a second set of coupled transmission line sections 81A, 81B and 81C. Coupled transmission line sections 80A and 81A are connected in series with one another, and coupled transmission line sections 80B and 81B are also connected in series with one another. The outer ends of coupled transmission line sections 80A and 81A are connected to respective terminals of the differential port 82. The outer ends of coupled transmission line sections 80B and 81B are connected respectively to the outer ends of coupled transmission line sections 80C and 81C. The inner end of coupled transmission line section 81C is connected to the single-ended port 83. The inner end of coupled transmission line section 80C is left open circuit.

Preferably, the balun 88 of FIG. 8 includes size-reducing shunt capacitors 84A and 84B, connected respectively to the outer ends of coupled transmission line sections 80A and 81A. It is also preferred that the balun 88 includes size-reducing shunt capacitors 85A and 85B, connected respectively at the nodes where outer ends of coupled transmission line sections 80B and 80C meet and where coupled transmission line sections 81B and 81C meet respectively.

Preferably, the balun 88 includes a shunt capacitor 86 connected at the node where the respective inner ends of coupled transmission line sections 80A and 81A are connected together. The effect of shunt capacitor 86 is to improve the ratio of the single-ended to differential mode response of the balun 88 and the single-ended to common mode response of the balun 88 over a given frequency range.

During use of balun circuits 78, 88, electromagnetic coupling occurs between the respective transmission line sections of each set, and in particular, when the balun circuits 78, 88 carry signals in the respective operating frequency bands. The coupling of transmission lines may be determined by the proximity of the transmission lines to one another, by the characteristics of the substrate in which they are embedded and by the manner in which they are aligned. Broadside coupling of transmission lines within each set is preferred, especially wherein each transmission line in a set is substantially in register with each other transmission line in the set. Even though the electromagnetic coupling occurs during use, the transmission lines within each set may be referred to as coupled transmission lines, since they are arranged such that coupling occurs during use.

In FIGS. 7 and 8, the respective baluns 78, 88 have three transmission line sections in each coupled set. In alternative embodiments (not illustrated), each set of coupled transmission line sections may include more than three coupled transmission line sections.

Figure 9:
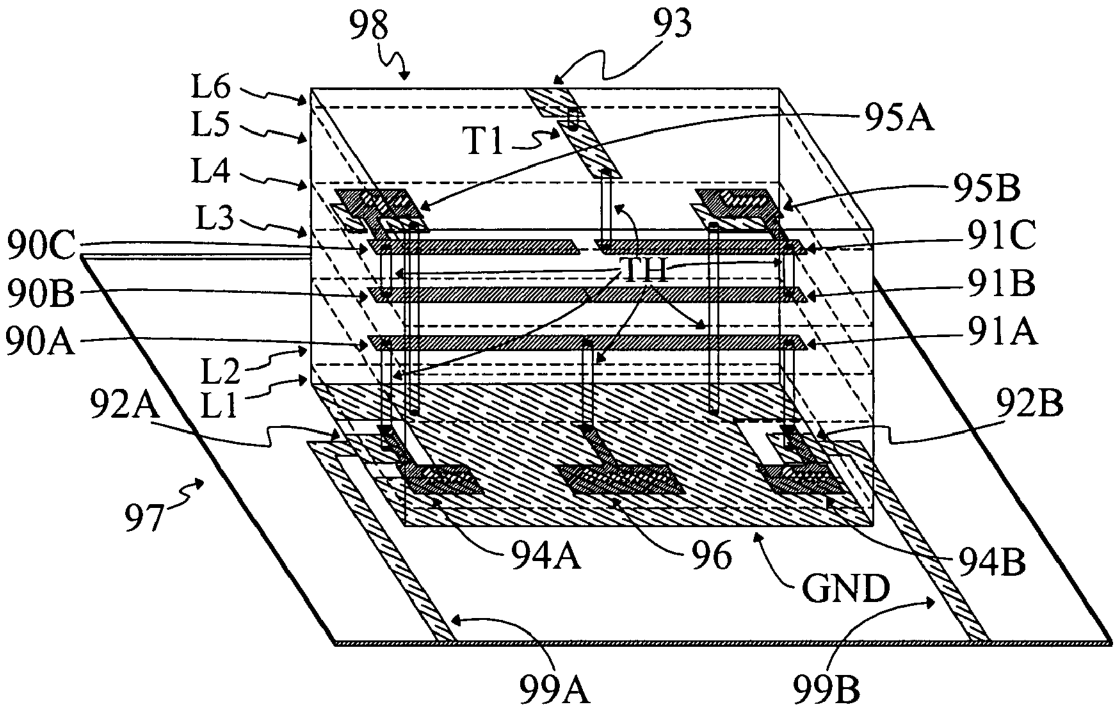
FIG. 9 shows a three dimensional layout of the balun of FIG. 6 when implemented using the balun circuit of FIG. 8, suitable for fabrication in a multilayer substrate such as low temperature co-fired ceramic (LTCC)

FIG. 9 shows, generally indicated as 98, an example of a three dimensional implementation of the balun 88, suitable for fabrication in a multilayer substrate such as low temperature co-fired ceramic (LTCC). The balun 98 may be fabricated in a multilayer substrate comprising 6 insulating or dielectric layers, L1 to L6, with metal patterns on the top of each layer to provide the balun components. A ground electrode GND and a pair of I/O electrodes 92A and 92B are disposed on the underside (as viewed in FIG. 9) of the balun 98 where the I/O electrodes 92A and 92B correspond to the signal-carrying terminals of the differential port 82 of FIG. 8. The balun 98 comprises a first set of broadside coupled transmission line sections 90A, 90B, 90C, and a second set of broadside coupled transmission line sections 91A, 91B, 91C. Coupled transmission line sections 90A and 91A are connected in series with one another and coupled transmission line sections 90B and 91B are also connected in series with one another. The outer ends of coupled transmission line sections 90A and 91A are connected to differential I/O electrodes 92A and 92B respectively via conducting vias or through holes TH formed in the insulating substrate. The outer ends of coupled transmission line sections 90B and 91B are connected to the outer ends of coupled transmission line sections 90C and 91C respectively by means of electrically conducting through holes TH. The inner end of coupled transmission line section 91C is connected to I/O electrode 93 by means of a pair of through holes TH and a metal trace Ti fabricated on the upper (as viewed in FIG. 9) surface of dielectric layer L5. I/O electrode 93 corresponds to the signal-carrying terminal of the single-ended port 83 of FIG. 8.

The balun 98 further comprises shunt capacitors 94A and 94B connected to the outer ends of coupled line sections 90A and 91A, shunt capacitors 95A and 95B connected to the outer ends of coupled line sections 90C and 91C, and shunt capacitor 96 connected at the point where coupled line sections 90A and 91A are connected together.

The balun 98 is mounted on a substrate 97 comprising I/O trace lines 99A and 99B, which may be connected to the differential I/O port of a transceiver circuit (not shown) located elsewhere on the surface of substrate 97. It will be seen that the terminals 92A, 92B of the differential port are located on opposite sides of the balun 98, while the terminal 93 of the single ended port is located between and above (with respect to the substrate) the terminals 92A, 92B. In particular, in the illustrated embodiment, the single ended I/O terminal 93 is located towards, or substantially at, the centre of one of the sides of the top surface of the balun 98. Hence, the balun 98 is suitable for connection to, for example, the chip antenna 50 of FIG. 5, and as shown in FIG. 6.

Figure 10A:
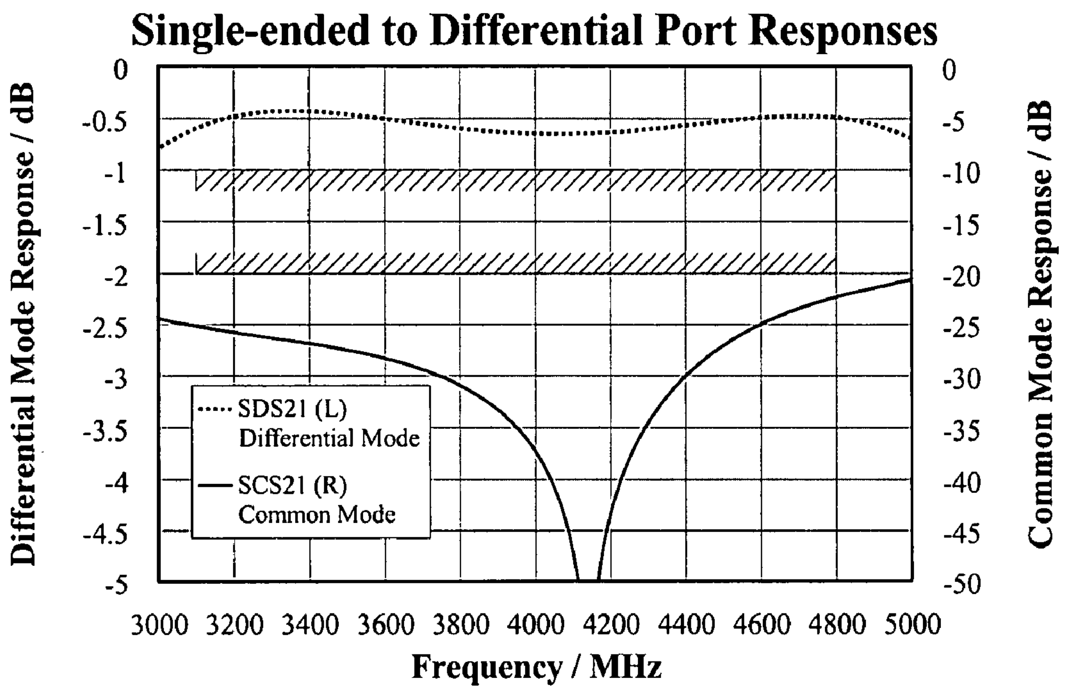
FIG. 10A shows the differential mode response and the common mode response resulting from a circuit simulation of the balun circuit of FIG. 8.

FIG. 10A shows the differential mode response and the common mode response resulting from a circuit simulation of the balun of FIG. 8, where the physical dimensions of the coupled line sections 80A, 80B, 80C and 81A, 81B, 81C and the capacitors 84A, 84B and 85A, 85B are chosen to provide a balun with an operating band from 3.168 to 4.752 GHz which coincides with band group I of the Ultra Wide Band system as defined by the WiMedia Alliance.

It can be seen that the insertion loss of a differential signal is marginally higher than 0.5 dB across the band, and that the attenuation of common mode signal is 20 dB or greater across the band. Both of these results are acceptable considering the bandwidth.

Figure 10B:
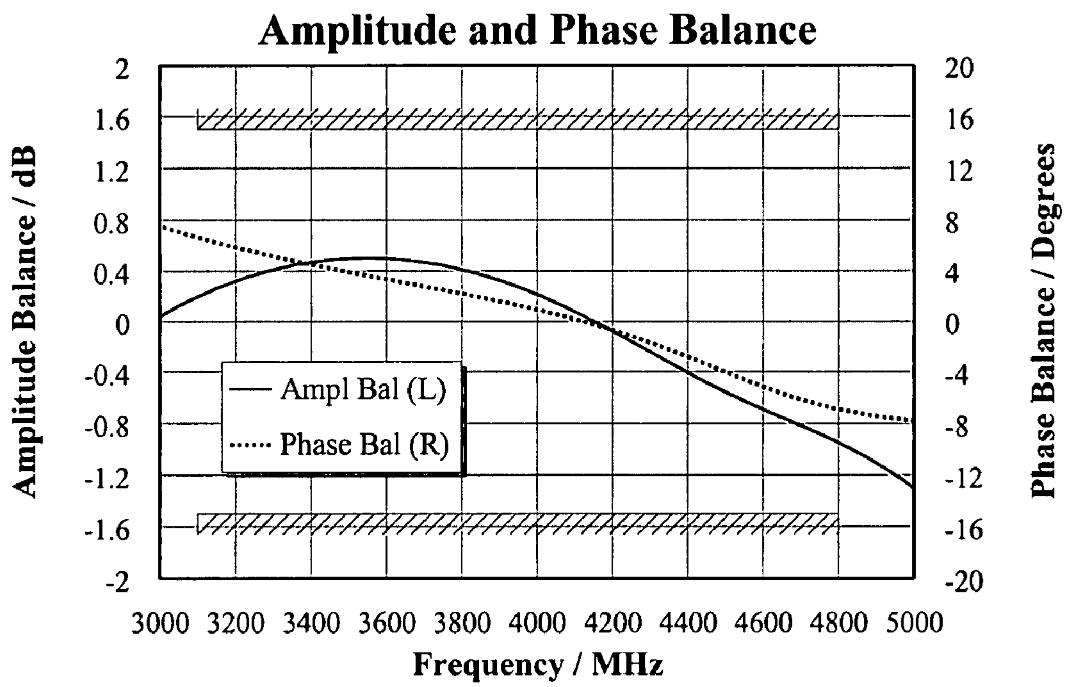
FIG. 10B shown the amplitude and phase balance resulting from the same circuit simulation.

FIG. 10B shown the amplitude and phase balance of the balun of FIG. 8. It can be seen that amplitude balance is better than +/−1 dB across the operating band, and the phase balance is better than +/−10 degrees across the operating band of the balun.

In the preferred embodiment, the first and second sets of coupled transmission line sections are not connected directly to electrical ground at any point along the lengths of the constituent transmission line sections of said coupled transmission line sections. Moreover, connections to electrical ground from said coupled transmission line sections are advantageously made via shunt capacitors.

In preferred embodiments, the combined length of the respective first, second or third transmission line section of the first set of coupled transmission line sections and the corresponding first second or third transmission line section of the second set of coupled transmission line sections is less than one half of the wavelength of a signal at the centre of the operating frequency band of the balun. In alternative embodiments, where size reducing capacitors are not used, the combined length of the respective first, second or third transmission line section of the first set of coupled transmission line sections and the corresponding first second or third transmission line section of the second set of coupled transmission line sections is preferably substantially equal to one half of the wavelength of a signal at the centre of said operating frequency band of the balun The balun is usually mounted on a carrier substrate and may be positioned adjacent to an antenna mounted on the same carrier substrate, wherein electrical connection is made from the single-ended I/O port of the balun to the antenna by an electrical connector.

The antenna is advantageously fabricated within the same substrate as the balun. The combination of the balun and antenna within a single substrate ostensibly providing a balanced feed antenna.

The invention is not limited to the embodiments described herein which may be modified or varied without departing from the scope of the invention.

The invention claimed is:

1. A balun comprising a single-ended port comprising a signal-carrying terminal; a differential port comprising a first signal-carrying terminal and a second signal-carrying terminal; and first and second sets of coupled transmission line sections, said first and second sets being located adjacent to one another; each of said first and second sets comprising a respective first transmission line section and a respective second transmission line section, each transmission line section within each set having a respective inner end and a respective outer end, said respective first transmission line sections being connected together in series at their respective inner ends, said respective second transmission line sections being connected together in series at their respective inner ends, wherein each of said first and second sets includes a respective third coupled transmission line section having a respective outer end connected to the respective outer end of the respective second transmission line section, and wherein said signal-carrying terminal of said single-ended port is connected to an inner end of one of said third coupled transmission line sections, and wherein said first and second signal-carrying terminals of said differential port are connected to a respective outer end of said first transmission line sections.

2. A balun as claimed in claim 1, wherein said transmission line sections of at least one of said first and second sets are coupled in a broadside manner.

3. A balun as claimed in claim 1, wherein said transmission line sections of at least one of said first and second-sets are substantially in register with one another in a direction transverse of each of said transmission line sections in the respective set.

4. A balun as claimed in claim 1, wherein a respective shunt capacitor is connected between said respective outer ends of said first transmission line sections and electrical ground.

5. A balun as claimed in claim 1, wherein a respective shunt capacitor is connected between said respective inner ends of said third transmission line sections and electrical ground.

6. A balun as claimed in claim 1, wherein a respective shunt capacitor is connected between said respective outer ends of said third transmission line sections and electrical ground.

7. A balun as claimed in claim 1, wherein a shunt capacitor is connected between said connected inner ends of said first transmission line sections and electrical ground.

8. A balun as claimed in claim 1, wherein the combined lengths of said respective first transmission line sections of said first and second sets is less than one half of the wavelength of a signal at a centre frequency of an operating frequency band of said balun.

9. A balun as claimed in claim 1, wherein the combined lengths of said respective second transmission line sections of said first and second sets is less than one half of the wavelength of a signal at a centre frequency of an operating frequency band of said balun.

10. A balun as claimed in claim 1, wherein the combined lengths of said respective third transmission line sections of said first and second sets is less than one half of the wavelength of a signal at a centre frequency of an operating frequency band of said balun.

11. A balun as claimed in claim 1, comprising a multi-layer insulating substrate in which said first and second sets of coupled transmission line sections are arranged in a respective stack, said respective stacks being located adjacent to one another in said multi-layer insulating substrate.

12. A balun as claimed in claim 11, wherein each transmission line section within a respective stack is provided on a respective layer of the multi-layer substrate.

13. A balun as claimed in claim 12, wherein said respective first transmission line sections are provided on a respective common substrate layer, said respective second transmission line sections are provided on a respective common substrate layer, and said respective third transmission line sections are provided on a respective common substrate layer.

14. A balun as claimed in claim 13, wherein connections between adjacent transmission line sections on a respective common substrate layer are made by arranging said adjacent transmission line sections to be contiguous.

15. A balun as claimed in claim 11, wherein connections between transmission line sections in non-common substrate layers are made by at least one electrically conductive via.

16. A balun as claimed in claim 11, wherein said multi-layer substrate has an obverse face and a reverse face, said reverse face being mountable on a support substrate, and wherein said respective stacks are arranged such that said respective first transmission line sections are located proximal said obverse face, said respective third transmission line sections are located proximal said reverse face and said respective second transmission line sections are located between said respective first and third transmission line sections.

17. A balun as claimed in claim 16, wherein said signal-carrying terminal of said single-ended port is provided at, said obverse face and said first and second terminals of said differential port are provided at said reverse face.

18. A balun as claimed in claim 16, wherein said first and second signal-carrying terminals of said differential port are located at respective opposite sides of said multi-layer substrate, said signal-carrying terminal of said single-ended port being located between said opposite sides.

19. A balun as claimed in claim 18, wherein said signal-carrying terminal of said single-ended port is located substantially midway between said opposite sides.

20. A balun as claimed in claim 16, wherein said signal-carrying terminal of said single-ended port is electrically connected to a single-ended port of an antenna, wherein said antenna and balun are mounted adjacent to one another on a support substrate with said respective single-ended ports being substantially aligned with one another.

21. A balun as claimed in claim 20, wherein said antenna and said balun are fabricated in a common multi-layer insulating structure.

* * * * *